United States Patent [19]

Suzuki et al.

[11] Patent Number: 4,707,671

[45] Date of Patent: Nov. 17, 1987

[54] ELECTRICAL TRANSMISSION LINE

[75] Inventors: Hirosuke Suzuki; Tetsuro Umebayashi, both of Saitama, Japan

[73] Assignee: Junkosha Co., Ltd., Japan

[21] Appl. No.: 861,418

[22] Filed: May 9, 1986

[30] Foreign Application Priority Data

May 31, 1985 [JP] Japan ............................. 60-117797
May 31, 1985 [JP] Japan ............................. 60-117798

[51] Int. Cl.[4] .......................... H01P 3/00; H01P 3/08; H01B 7/08
[52] U.S. Cl. ........................................ 333/1; 333/5; 333/238; 333/243; 174/36; 174/117 F; 174/117 FF
[58] Field of Search ................... 333/1, 4, 5, 236, 238, 333/243; 174/117 F, 117 FF, 36

[56] References Cited

U.S. PATENT DOCUMENTS

| | | | |
|---|---|---|---|
| 2,721,312 | 10/1955 | Grieg et al. | 333/238 |
| 3,093,805 | 6/1963 | Osifchin et al. | 333/1 |
| 3,459,879 | 8/1969 | Gerpheide | 333/1 X |
| 4,045,750 | 8/1977 | Marshall | 333/236 X |
| 4,382,236 | 5/1983 | Suzuki | 333/1 |
| 4,423,282 | 12/1983 | Suzuki et al. | 174/117 F X |
| 4,490,690 | 12/1984 | Suzuki | 333/1 |

OTHER PUBLICATIONS

East, *Cable and Connector* IBM Technical Disclosure Bulletin, vol. 18, No. 1, Jun. 1975, pp. 169, 170.

*Primary Examiner*—Paul Gensler
*Attorney, Agent, or Firm*—Mortenson & Uebler

[57] ABSTRACT

An electrical transmission unit line is provided comprising a porous dielectric layer having positioned on one side thereof a pair of narrow, parallel elongated electrical conductors and on the other side thereof, opposite the pair of conductors and extending transversely across both wires of the pair and parallel thereto, a wide ground conductor. An electrical transmission line having a plurality of such unit lines is also provided. The porous dielectric is preferably porous, expanded polytetrafluoroethylene. The transmission lines are covered with an electrically insulating material, preferably a nonporous plastic.

16 Claims, 12 Drawing Figures

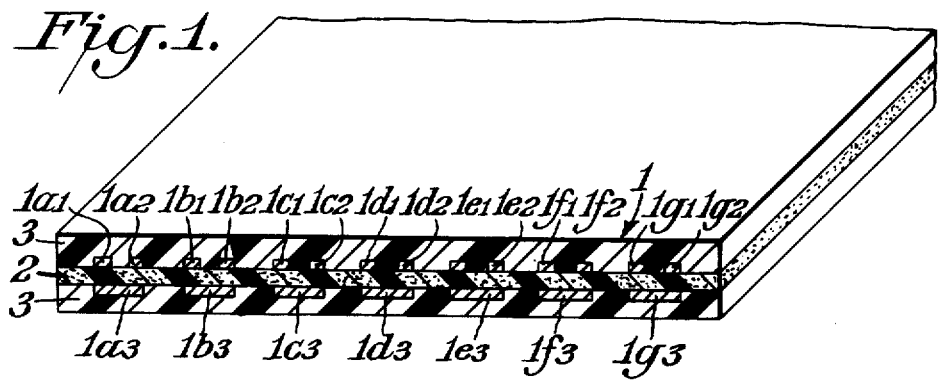
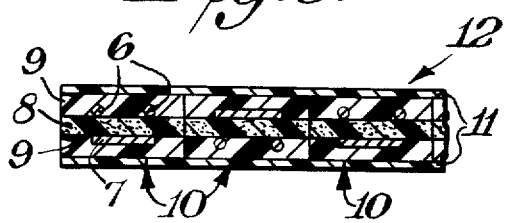
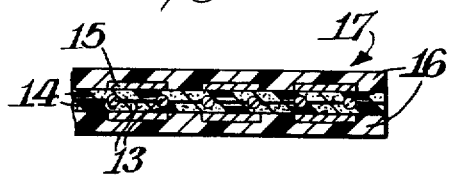
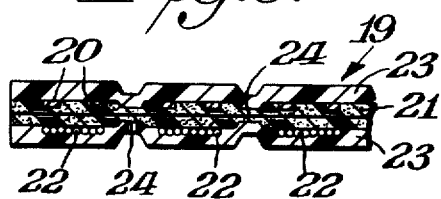

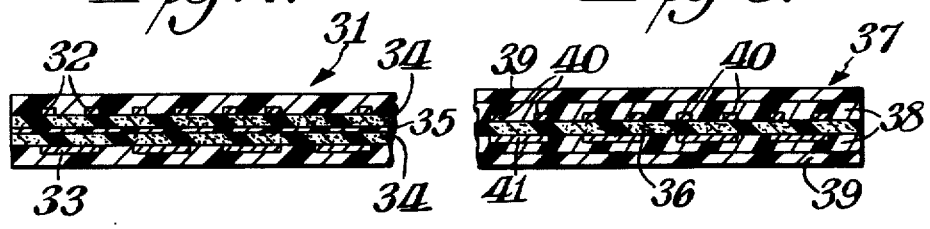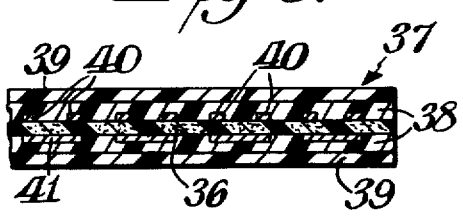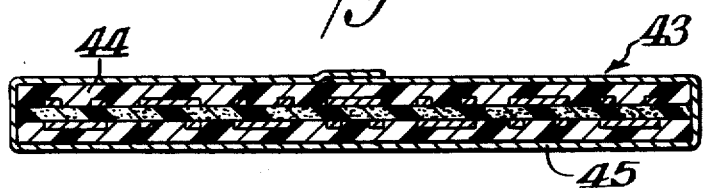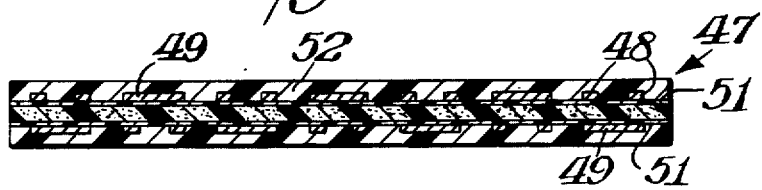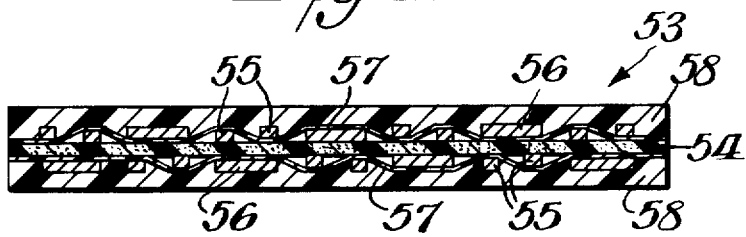

ELECTRICAL TRANSMISSION LINE

BACKGROUND OF THE INVENTION

The present invention relates to a transmission line which has reduced crosstalk and enables the packaging density to be increased over prior lines.

Lines which have heretofore been employed in signal transmission of this type include two-core parallel transmission lines, a twisted pair cable, or a cable composed of these as unit lines. It has therefore not been possible to attain a great reduction in crosstalk together with high packaging density and to obtain favorable flexibility.

As a high-speed and high-density line, for example, a flat cable has been proposed in the specification of Japanese Patent Publication No. 41243/1984. This flat cable is arranged such that ground wires are respectively disposed on both sides of one signal line. these signal and ground lines being alternately knit together by a solid tape, and porous polytetrafluoroethylene tapes are respectively disposed on both sides of the knit lines, and further, a plastic layer is disposed on the respective outer surfaces thereof, thereby forming a flat-cable-shaped transmission line. With this structure, however, it is difficult to increase the density in the lateral direction of the transmission line, and it is not possible to reduce crosstalk by a large margin and to decrease production costs.

The specification of Japanese Utility Model Laid-Open No. 179210/1982 discloses a coaxial conductor flat cable. This construction, however, also involves increased costs.

Accordingly, an object of the present invention is to provide a high-density transmission line which has reduced crosstalk and can be manufactured economically.

Another object of the present invention to provide a transmission line which has reduced crosstalk and makes it possible to satisfactorily obtain the advantages of balanced transmission and also attain an increased packaging density.

SUMMARY OF THE INVENTION

An electrical transmission line is provided comprising a porous dielectric layer having positioned on one side thereof at least one pair of narrow, parallel, elongated electrical conductors spaced apart from each other and, on the other side of the dielectric layer, opposite the pair of conductors and extending transversely across but not beyond both conductors of the pair and arranged parallel to the pair, at least one wide ground conductor, this assembly being covered with a solid, electrically insulating resin layer. The transmission line preferably has a plurality of pairs of conductors positioned on one side of the porous layer, each pair having at least one wide ground conductor positioned opposite the pair on the other side of the dielectric layer. The transmission line may have a second dielectric layer separating the pair of conductors from a second wide ground conductor opposite the pair of conductors and extending transversely across both conductors of the pair. The wide ground conductor may be a plurality of narrow conductors disposed parallel to and in contact with each other. A separation layer may be positioned between the pair of conductors and the porous dielectric, or between the ground conductor and the porous dielectric. The transmission line may have at least one additional layer of a porous dielectric positioned between the signal conductors and the covering, or between the ground conductor and the covering. A transmission line may be formed of a plurality of the unit lines of the invention disposed in parallel relationship and connected together at at least a longitudinal portion thereof, thereby forming a flat-cable-shaped transmission line. The transmission line may have all pairs of conductors positioned on one side of the dielectric and all ground conductors positioned on the other side of the dielectric, but preferably has pairs of conductors and ground conductors alternately disposed on both sides of the dielectric layer. A portion of the porous dielectric layer between adjacent sets of conductor pairs and ground conductor may be compressed to increase the density of that portion. A solid film may be disposed between the porous dielectric and the conductors, or it may be interleaved alternately through the conductors in the transverse direction across the line. The transmission line may be provided with an antistatic layer on the outer surface of the covering resin layer or with an outer shielding layer.

BRIEF DESCRIPTION OF THE DRAWINGS

FIG. 1 is a pictorial view, partly in cross-section of one embodiment of the invention.

FIG. 2 is a cross-section of another embodiment according to the invention.

FIGS. 3 through 8 are fragmentary horizontal cross-sectional views of further embodiments of the invention.

FIGS. 9 through 12 are horizontal cross-sectional views of still further embodiments of transmission lines according to the invention.

DETAILED DESCRIPTION OF THE INVENTION AND PREFERRED EMBODIMENTS WITH REFERENCE TO THE DRAWINGS

An electrical transmission unit line is provided comprising a porous dielectric layer having positioned on one side thereof a pair of narrow, parallel elongated electrical conductors and on the other side thereof, opposite the pair of conductors and extending transversely across both wires of the pair and parallel thereto, a wide ground conductor. An electrical transmission line having a plurality of such unit lines is also provided. The porous dielectric is preferably porous, expanded polyterafluoroethylene. The transmission lines are covered with an electrically insulating material, preferably a nonporous plastic.

According to the present invention, a transmission line is provided comprised of a basic unit line or a plurality of unit lines disposed adjacent to each other, each unit line comprising a pair of parallel signal conductors spaced apart from each other, a wide ground conductor opposite the pair of conductors such as to extend transversely over both conductors, and a porous dielectric layer interposed between the pair of conductors and the wide ground conductor.

In the above arrangement, if a wide conductor is disposed on both of the sides of the pair of conductors separated therefrom by two porous dielectric layers, it is possible to further reduce crosstalk.

A multiplicity of sets of conductors, signal and ground, may be disposed along the plane of a common porous dielectric layer in the form of film so as to be integrated together in the shape of a flat cable in which unit lines are disposed adjacent to each other. Furthermore, the arrangement may be such that each of the unit lines is provided on its outer periphery portion thereof with a supporting insulator and is formed such as to have a rectangular cross-section as a whole, and the unit lines are disposed in such a manner that any desired rectangular surfaces are placed adjacent to each other horizontally or vertically or in a mixed direction of horizontal and vertical directions, and the unit lines are then connected together at at least a longitudinal portion thereof, thereby forming a rattan-blind-like flat cable or any desired group of cables.

By the present invention, it is possible to increase the lateral packaging density, because it is only necessary for the transmission line to possess a dimension which enables two conductors to be accommodated in such a manner that they are disposed parallel to each other and spaced apart from each other, whereas it has heretofore been necessary to accommodate three conductors disposed laterally. In addition, the existence of the wide conductor makes it difficult for crosstalk to occur even when unit lines are laid one upon another vertically. Therefore, it is also possible to increase the vertical packaging density. If one of the pair of signal conductors and the wide ground conductor in each of the unit lines disposed adjacent to each other are maintained at ground potential, and the other conductor in each unit line is employed as a signal line, the greater part of the outer peripheral portion of each signal line is isolated by ground potential, which makes it possible to obtain a transmission line with reduced crosstalk.

The ground line may be formed from a plurality of narrow conductors disposed parallel to and in electrical contact with each other, thereby improving flexibility. The porous dielectric may be formed from a plurality of layers and have a separation layer provided between any desired pair of adjacent layers, thereby facilitating terminal processing. In addition to the porous dielectric provided between the signal lines and the ground line, additional porous dielectric layers may be respectively provided between one supporting insulator and the signal lines and between the other supporting insulator and the ground line, thereby reducing the signal transmission loss and increasing the transmission speed.

Further, in the above arrangement according to the present invention, it is possible to increase the packaging density by disposing a plurality of unit lines parallel to each other, each consituting a balanced transmission line with a rectangular cross-section, and laterally connecting them together at at least a longitudinal portion thereof, thereby forming a flat-cable-shaped transmission line, or providing a multiplicity of sets of signal and ground lines along the plane of a porous dielectric in the form of film, thereby forming a flat-cable-shaped transmission line.

In one embodiment, balanced signal transmission is effected by simultaneous transmission of two signals through the pair of conductor lines, respectively, a positive signal through one of the pair of lines, and a negative signal, that is, a signal opposite in polarity with respect to the former signal, through the other line. The balanced signal transmission has relatively small crosstalk and permits the output voltage to be increased as well as enabling the characteristic impedance to be raised easily, which offers various advantages. For example, it is possible to reduce the insertion loss of the transmission line. Thus, this balanced transmission is desirable.

Thus, according to the present invention, a balanced transmission line comprises a pair of parallel signal lines spaced apart from each other, a ground line disposed opposite the signal lines and extending over both of them, a porous dielectric layer disposed between the signal lines and the ground line, and supporting insulators for supporting at least the signal lines and the ground line, respectively, so that they are electrically insulated. By virtue of this arrangement, the ground line, which shields the signal lines against any signal from adjacent lines or any signal from the outside, thus reducing crosstalk. As a consequence, signal lines adjacent to each other can be arranged in close proximity with each other, and this enables the packaging density to be increased.

Further, because the porous dielectric is disposed between the signal lines and the ground line in the arrangement according to the present invention, the transmission line has excellent transmission characteristics and improved flexibility.

A detailed description of the invention and preferred embodiments is best provided with reference to the drawings wherein FIG. 1 is a pictorial view, partly in cross-section, of one embodiment of a flat-cable-shaped balanced transmission line 1 according to the present invention. In the case of this balanced transmission line 1, a plurality of pairs (seven pairs in this case) of signal lines $1a_1, 1a_2, \ldots 1g_1, 1g_2$ are arranged on one surface of a film-shaped porous dielectric 2 comprising a stretched and sintered polytetrafluoroethylene tape having a thickness of 0.20 mm, each pair of signal lines being of the silver-plated flat-type conductors having a width of 0.2 mm and a thickness of 0.1 mm, the conductors being parallel to each other and spaced apart from each other at a center-to-center distance of 0.8 mm. Ground lines $1a_3, 1b_3 \ldots 1g_3$ are disposed across the dielectric opposite these pairs of signal lines, each ground line being of the silver-plated flat-type conductor having a width of 1.27 mm and a thickness of 0.1 mm, and each ground line extending in the transverse direction over both of the conductors in the corresponding pair of signal lines and being spaced apart from an adjacent ground line at a center-to-center distance of 2.5 mm, thus forming seven sets of combinations of signal and ground lines. The lines $1a_1 \ldots 1g_2$ and $1a_3 \ldots 1g_3$ are supported by supporting insulators 3 so that they are electrically insulated, the supporting insulators 3 respectively disposed on the outsides of the signal and ground lines. As the supporting insulators 3, it is preferable to employ, for example, a solid polytetrafluoroethylene resin, but other electrically insulating materials may also be employed. Similarly, it is possible to employ various kinds of porous materials or expanded porous materials in place of the porous polytetrafluoroethylene dielectric 2.

For the lines, conductors having various shapes may be employed, such as round conductors, in addition to the flat-type conductors shown, and, as to the material for the lines, it is possible to employ various kinds of electrical conductors in addition to metallic conductors.

With the flat-cable-shaped balanced transmission line 1 manufactured in the shape shown in FIG. 1, the characteristic impedance between the signal lines $1a_1$-$1a_2, \ldots 1g_1$-$1g_2$ was 120 ohms and the propagation delay time was $3.9 \pm 1$ sec./meter. In addition, crosstalk was quite low. Although it is possible to further reduce crosstalk by, for example, increasing the distance between each pair of adjacent sets of lines, this would decrease the packaging density.

FIG. 2 shows another embodiment which makes it possible to further reduce crosstalk without decreasing packaging density. In this case also, a flat-cable-shaped balanced transmission line 5 is exemplified.

In the balanced transmission line 5 in accordance with this embodiment, ground lines $5a_3 \ldots 5g_3$ which are disposed, respectively, opposite pairs of signal lines $5a_1, 5a_2 \ldots 5g_1, 5g_2$, are alternately disposed on both sides of the film-shaped porous dielectric 2 and are supported by the supporting insulators 3 so that they are insulated. As a consequence, the pairs of signal lines $5a_1, 5a_2 \ldots 5g_1, 5g_2$ are also alternately disposed on both sides of the porous dielectric 2, and they are thereby isolated from each other by the ground potentials disposed in a wavy form, thus substantially eliminating crosstalk.

FIG. 3 shows still another embodiment of the present invention. FIG. 3 is a fragmentary horizontal sectional view of a rattan-blind-like flat cable 12 which is comprised of unit lines 10 having a rectangular cross-section. Each of the unit lines 10 is composed of a pair of signal lines 6, each being a round conductor, a ground line 7 being a flat conductor disposed opposite the signal lines 6, 6 while extending transversely over both of them, and a porous dielectric 8 disposed between the signal and ground lines, the porous dielectric 8 being supported by supporting insulators 9. A plurality of unit lines 10 are disposed parallel to each other, and the respective supporting insulators of the adjacent unit lines are connected together by, for example, connecting layers 11, such as by welding or bonding these layers, at at least a longitudinal portion of the unit lines 10.

FIG. 4 is a fragmentary horizontal sectional view of a flat-cable-shaped balanced transmission line 17 in which each of the pairs of signal lines 13, 13, each being a round conductor, are held between two films of a dielectric 14, 14, and ground lines 15 are, respectively, provided on both sides of each pair of signal lines 13, 13 while extending transversely over both of them, the ground lines 15 being supported by supporting insulators 16 so that they are electrically insulated. In this embodiment because the ground lines 15 are disposed on both sides of the signal lines 13, crosstalk is further reduced, and the shielding effect is enhanced.

FIGS. 5 to 12 respectively show further embodiments of the flat-cable-shaped balanced transmission line according to the present invention which differ from each other.

In the case of a flat-cable-shaped balanced transmission line 19 in accordance with the embodiment shown in FIG. 5, each ground line 22 which is opposite each pair of signal lines 20, 20 and extending over both of them across porous dielectric 21 comprises a plurality of round conductors disposed in close contact with each other, thereby providing the cable with improved transverse and longitudinal flexibility. The porous dielectric between each pair of adjacent sets of signal and ground lines is compressed from the respective outsides of supporting insulators 23 which are respectively disposed on the outsides of the porous dielectric 21. In this way, the porous dielectric 21 is partially compressed so as to increase the density of the compressed portions and provide substantially solid portions 24 which can transmit signals more readily than the porous portion of the dielectric 21, whereby transmission of signals to adjacent sets of lines is prevented, and crosstalk is thereby still further reduced.

The flat-cable-shaped balanced transmission line 25 illustrated in FIG. 6 shows an embodiment in which a pair of signal lines 27 and a ground line 28, disposed opposite each other across a porous dielectric 26, are respectively supported by supporting insulators 30 from which they are insulated and separated by second porous dielectric sheets 29 independent of the porous dielectric 26, thereby improving the transmission characteristics still further.

The flat-cable-shaped balanced transmission line 31 illustrated in FIG. 7 shows an embodiment in which a porous dielectric 34 disposed between pairs of signal lines 32 and ground lines 33 formed from a plurality of film-shaped layers (two layers in this case), and having a separation layer 35 of nonporous PTFE another porous PTFE film disposed between these layers, thereby facilitating terminal processing of this cable.

The flat-cable-shaped balanced transmission line 37 illustrated in FIG. 8 shows an embodiment in which antistatic layers 39 such as conductive, carbon-filled resin layers are respectively disposed on the respective outer surface portions of supporting insulators 38, thereby substantially eliminating the risk of any electrostatic potential at the supporting insulators 38 and the like causing dielectric breakdown of circuits connected to the transmission line 37 or circuit elements connected thereto through signal lines 40 or ground lines 41 separated by porous dielectric 36.

The flat-cable-shaped balanced transmission line 43 illustrated in FIG. 9 shows an embodiment in which a metal shielding layer 45 is provided over the outer surface portions of the cable 43.

FIGS. 10 and 11, respectively, show embodiments of a flat-cable-shaped balanced transmission line having a structure in which the dielectric strength between each pair of adjacent lines is increased. The flat-cable-shaped balanced transmission line 47 illustrated in FIG. 10 comprises an embodiment in which solid plastic films 51 are disposed between the pairs of signal lines 48 and ground lines 49 on one side of a porous dielectric 50 and between the porous dielectric 50 and the pairs of signal lines 48 and ground lines 49 on the other side, thereby increasing the dielectric strength of each set of lines. The flat-cable-shaped balanced transmission line 53 illustrated in FIG. 11 shows an embodiment in which solid plastic films 57 are disposed such as to alternately thread transversely through signal lines 55 and ground lines 56, which are disposed on each side of a film-shaped porous dielectric 54 such as to extend parallel to each other in the transverse direction across the transmission line 53, such that each film 57 has a wavy cross-section, thereby increasing the dielectric strength of each set of lines and that between each pair of adjacent sets of lines. It is to be noted that the reference numerals 52 and 58 in FIGS. 10 and 11 denote supporting insulators.

In the embodiment shown in FIG. 12, a protecting coating 61 is provided over the outer peripheral portions of supporting insulators 60 in a balanced transmission line formed in the shape of a flat cable. The protecting coating 61 is provided when a special mechanical protection is required, and may be formed by employing various kinds of materials, such as a resin, a metal or a fiber.

In one embodiment according to the invention depicted in FIG. 2, if one conductor in each pair of conductors, that is, $5a_1, 5b_1 \ldots 5g_1$, and the wide conductors $5a_3 \ldots 5g_3$ are all employed as ground lines and the other conductors $5a_2, 5b_2 \ldots 5g_2$ are employed as signal lines, the periphery of each signal line is at ground potential, which further reduces the crosstalk between the signal lines adjacent to each other. In addition, because the wide conductors are present in the transmission line 5 with the above structure, even if some transmission lines 5 are laid one upon another vertically, the crosstalk is smaller and is even smaller than that in the case of the transmission line 5 employed as a single layer.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A high conductor density electrical transmission line comprising a porous dielectric layer having positioned on one side thereof at least one pair of narrow, parallel elongated electrical conductors spaced apart from each other and on the other side of said layer, opposite said pair of conductors and extending transversely across but not beyond both conductors of said pair and arranged parallel to said pair, at least one wide ground conductor, this assembly being covered with a solid, electrically insulating resin layer.

2. The transmission line of claim 1 comprising a plurality of said pairs of conductors positioned on one side of said porous layer, each pair having at least one wide ground conductor positioned opposite said pair on the other side of said dielectric layer.

3. The transmission line of claim 1 having a second dielectric layer separating said pair of conductors from a second wide ground conductor opposite said pair of conductors and extending transversely across both conductors of said pair.

4. The transmission line of claim 1 wherein said wide ground conductor comprises a plurality of narrow conductors disposed parallel to and in contact with each other.

5. The transmission line of claim 1 having a separation layer positioned between said pair of conductors and said porous dielectric.

6. The transmission line of claim 1 having a separation layer positioned between said ground conductor and said porous dielectric.

7. The transmission line of claim 1 having at least one additional layer of a porous dielectric positioned between said signal conductors and said solid, electrically insulating resin layer.

8. The transmission line of claim 1 having at least one additional layer of a porous dielectric positioned between said ground conductor and said solid, electrically insulating resin layer.

9. A plurality of the transmission lines of claim 1 disposed in parallel relationship and being connected together at at least a longitudinal portion thereof, thereby forming a flat-cable-shaped transmission line.

10. The transmission line of claim 2 wherein all said pairs of conductors are positioned on one side of said dielectric and all said ground conductors are positioned on the other side of said dielectric.

11. The transmission line of claim 2 wherein said pairs of conductors and said ground conductors are alternately disposed on both sides of said dielectric layer.

12. The transmission line of claim 2 wherein a portion of said porous dielectric layer between adjacent sets of conductor pairs and ground conductor is compressed to increase the density of said portion.

13. The transmission line of claim 2 wherein a solid film is disposed between said porous dielectric and said conductors.

14. The transmission line of claim 2 wherein a solid film is interleaved alternately through said conductors in the transverse direction across said line.

15. The transmission line of claim 1 wherein an antistatic layer is provided on the outer surface of said covering resin layer.

16. The transmission line of claim 1 provided with an outer shielding layer.

* * * * *

UNITED STATES PATENT AND TRADEMARK OFFICE
CERTIFICATE OF CORRECTION

PATENT NO. : 4,707,671

DATED : November 17, 1987

INVENTOR(S) : Hirosuke Suzuki and Tetsuro Umebayashi

It is certified that error appears in the above-identified patent and that said Letters Patent is hereby corrected as shown below:

In column 6, line 15, between "PTFE" and "another", please insert —or—.

Signed and Sealed this

Seventh Day of June, 1988

Attest:

DONALD J. QUIGG

Attesting Officer

Commissioner of Patents and Trademarks